(12) United States Patent
Morishita et al.

(10) Patent No.: US 6,657,239 B1
(45) Date of Patent: Dec. 2, 2003

(54) POWER-SWITCHING SEMICONDUCTOR DEVICE

(75) Inventors: Kazuhiro Morishita, Fukuoka (JP); Katsumi Satoh, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/784,451

(22) PCT Filed: Jun. 29, 1999

(86) PCT No.: PCT/JP99/03457
§ 371 (c)(1),
(2), (4) Date: Feb. 27, 2001

(87) PCT Pub. No.: WO01/01495
PCT Pub. Date: Jan. 4, 2001

(51) Int. Cl.$^7$ ................................. H01L 29/45
(52) U.S. Cl. ................. 257/147; 257/107; 257/152; 257/153
(58) Field of Search ................. 257/107, 147, 257/152, 153

(56) References Cited

U.S. PATENT DOCUMENTS 4,542,398 A * 9/1985 Yatsuo et al. ............... 257/152
4,626,888 A * 12/1986 Nagano et al. ............. 257/149
4,843,449 A * 6/1989 Jaecklin et al. ............. 257/152
4,910,573 A * 3/1990 Roggwiller ................. 257/152

FOREIGN PATENT DOCUMENTS

| JP | 62-184759 | 11/1987 |
| JP | 6-204460 | 7/1994 |

* cited by examiner

*Primary Examiner*—Eddie Lee
*Assistant Examiner*—N. Drew Richards
(74) *Attorney, Agent, or Firm*—Oblon, Spivak, McClelland, Maier & Neustadt, P.C.

(57) ABSTRACT

In order to reduce a turn-on time of a power switching semiconductor device at a low cost, a first main electrode divided into a plurality of segments forming segment rows of a multi-concentric circle and a control electrode surrounding the segments are formed on a front major surface of a semiconductor substrate, and a second electrode is formed on a rear major surface thereof, and a turn-on operation is performed between the first main electrode and the second main electrode with a control signal inputted from the control electrode, specifying a relationship between a width of a segment and a distance between adjacent segments, and others.

1 Claim, 4 Drawing Sheets

POWER-SWITCHING SEMICONDUCTOR DEVICE

This application is based on PCT international application No. PCT/JP99/03457 which has an international filing date of Jun. 29, 1999 which designated the United States, the entire contents of which are incorporated by reference.

TECHNICAL FIELD

The present invention relates to improvement on a power switching semiconductor device such as a gate turn-off thyristor (hereinafter referred to as "GTO"), for example, which has a first main electrode divided into a plurality of segments and a control electrode surrounding the segments formed on a front major surface of a semiconductor substrate, and a second main electrode formed on a rear major surface thereof, respectively, and which performs a turn-on operation between the first main electrode and the second main electrode with a control signal inputted from the control electrode.

BACKGROUND ART

A conventional power switching semiconductor device of this kind will be described with reference to a schematic view of GTO shown in FIG. 4. FIG. 4 is a drawing of a semiconductor substrate viewed from a front major surface thereof.

A thyristor having a self arc-extinction capability such as GTO requires a structure endurable against a reverse bias at a turn-off, dissimilar to a common thyristor and a P base layer corresponding to a gate is formed in a mesa structure to achieve a withstand voltage of tens of volts. Cathode electrodes 1 (hereinafter referred to as "segments") of respective small thyristors each independently fabricated in a mesa structure are arranged radially and in a concentric double ring shape amounting to hundreds to thousands of pieces. A gate electrode 2 constituting a control electrode is formed on a front major surface 3a of a semiconductor substrate 3 in such a manner to surround the outer periphery of the segments 1.

Note that a first main electrode 4 is constituted by connecting the segments 1.

Further, an anode electrode 5 constituting a second main electrode is formed on a rear major surface 3b of the semiconductor substrate 3.

The following relations was established between an inner segment row 6 forming an inner concentric circle and an outer segment row 7 arranged in a circle concentric to and outside the inner concentric circle:

$0 < B_2 \leq \alpha_2 \times A_2$ $\alpha_2 \geq 1.8$ $(D_2 - C_2)/2 \leq \beta_2 \times A_2$ $\beta_2 \geq 1.8$ where $A_2$ is a width of a segment in a circumferential direction, $B_2$ a distance between adjacent segments in a circumferential direction, $C_2$ an outer diameter of the inner segment row, and $D_2$ an inner diameter of the outer segment row.

In the GTO fabricated in such a structure, it is well known to perform the turn-on and turn-off operations, but there has been a problem that a turn-on time is long and a switching action is slow.

The present invention has been made in light of conventional circumstances as described above, and it is accordingly an object of the present invention is to provide a power switching semiconductor device having a shorter turn-on time at a low cost without deteriorating the conventional characteristics.

DISCLOSURE OF THE INVENTION

The present invention is directed to a power switching semiconductor device, in which a first main electrode divided into a plurality of segments forming segment rows of a multi-concentric circle and a control electrode surrounding the segments are formed on a front major surface of a semiconductor substrate, and a second main electrode is formed on a rear major surface thereof, and a turn-on operation is performed between the first main electrode and the second main electrode with a control signal inputted from the control electrode, wherein a turn-on time is reduced without adopting any special structure by specifying a relationship among the maximum width of a segment in a circumferential direction, the minimum distance between adjacent segments in a circumferential direction arrangement, an outer diameter of an inner segment row, and an inner diameter of an outer segment row.

BEST MODE FOR CARRYING OUT THE INVENTION

Detailed description will be given of the present invention based on FIGS. 1 to 3.

Figure 1:
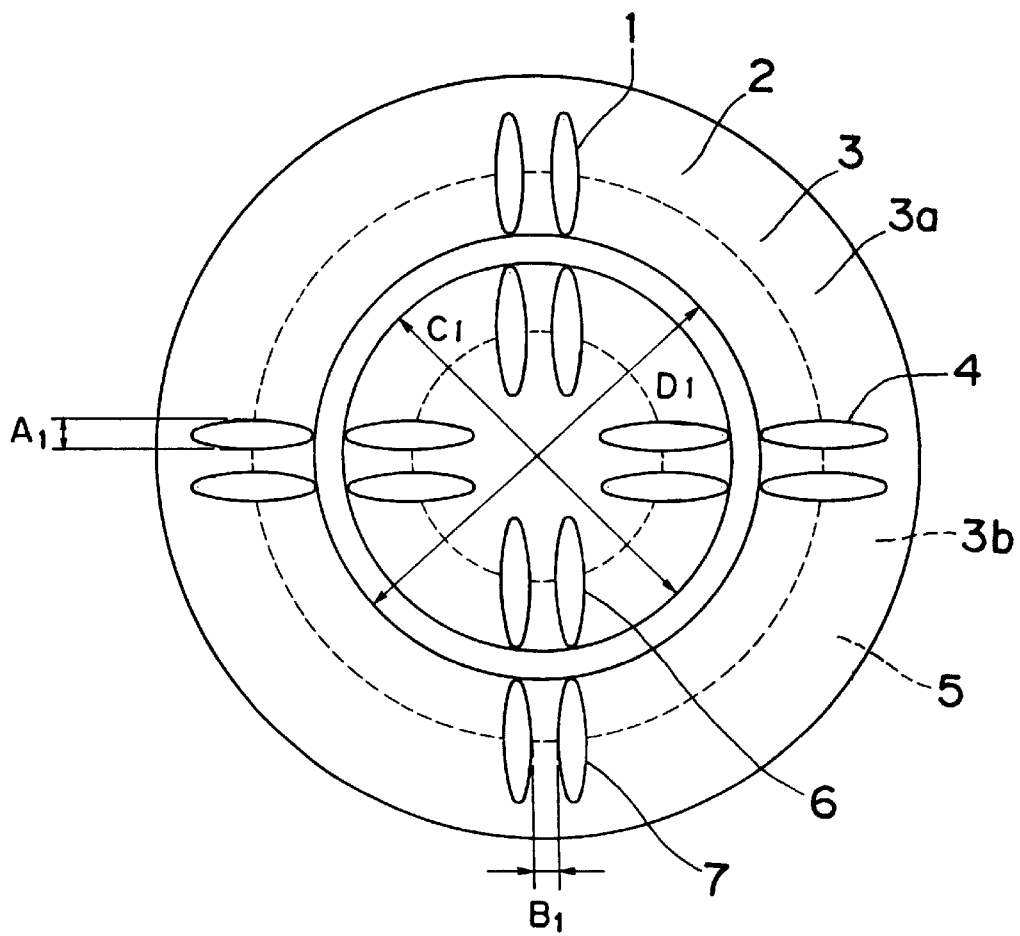
FIG. 1 is a schematic view showing a structure of a first embodiment of the present invention.
Figure 2:
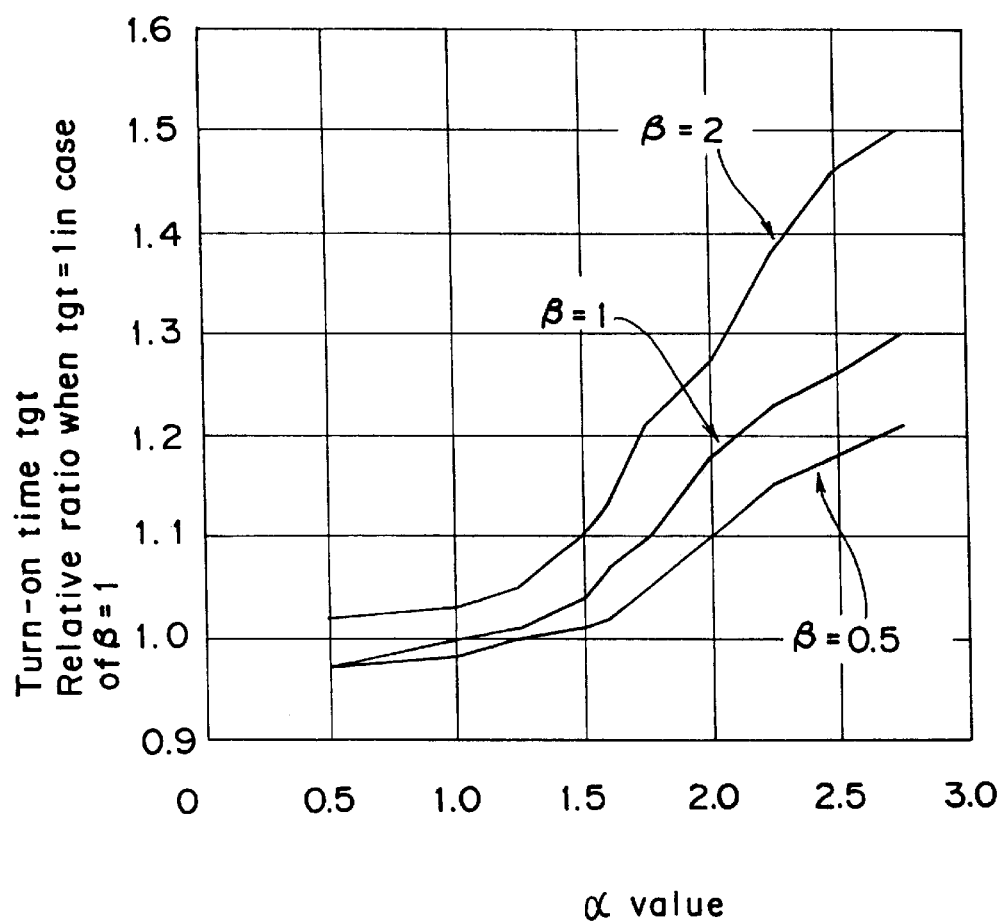
FIG. 2 is a graph of turn-on characteristics of the first embodiment of the present invention.
Figure 3:
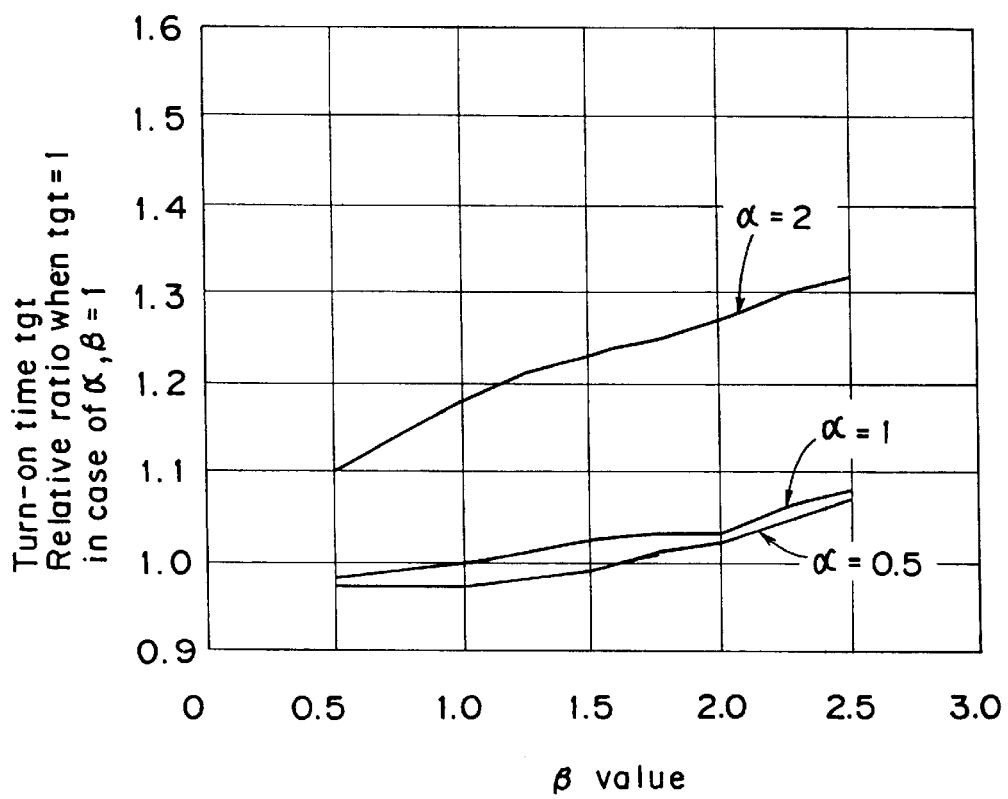
FIG. 3 is a graph of turn-on characteristics of the first embodiment of the present invention.

FIG. 1 is a schematic view showing a structure of a first embodiment of the present invention, and FIGS. 2 and 3 are graphs showing turn-off characteristics of a power switching semiconductor device of the first embodiment of the present invention.

In FIG. 1, $A_1$ is a width of a segment 1 in a circumferential direction, $B_1$ a distance between adjacent segments 1 in a circumferential direction arrangement, $C_1$ an outer diameter of an inner segment row and $D_1$ an inner diameter of an outer segment row, and there is established the following relations:

$0 < B_1 \leq \alpha_1 \times A_1$ $\alpha_1 \leq 1.5$ $(D_1 - C_1)/2 = \beta_1 \times A_1$ $\beta_1 \leq 1.5$ where $A_1$ is a width of a segment 1 in a circumferential direction, $B_1$ a distance between adjacent segments 1 in a circumferential direction arrangement, $C_1$ an outer diameter of an inner segment row and $D_1$ an inner diameter of an outer segment row.

Figure 4:
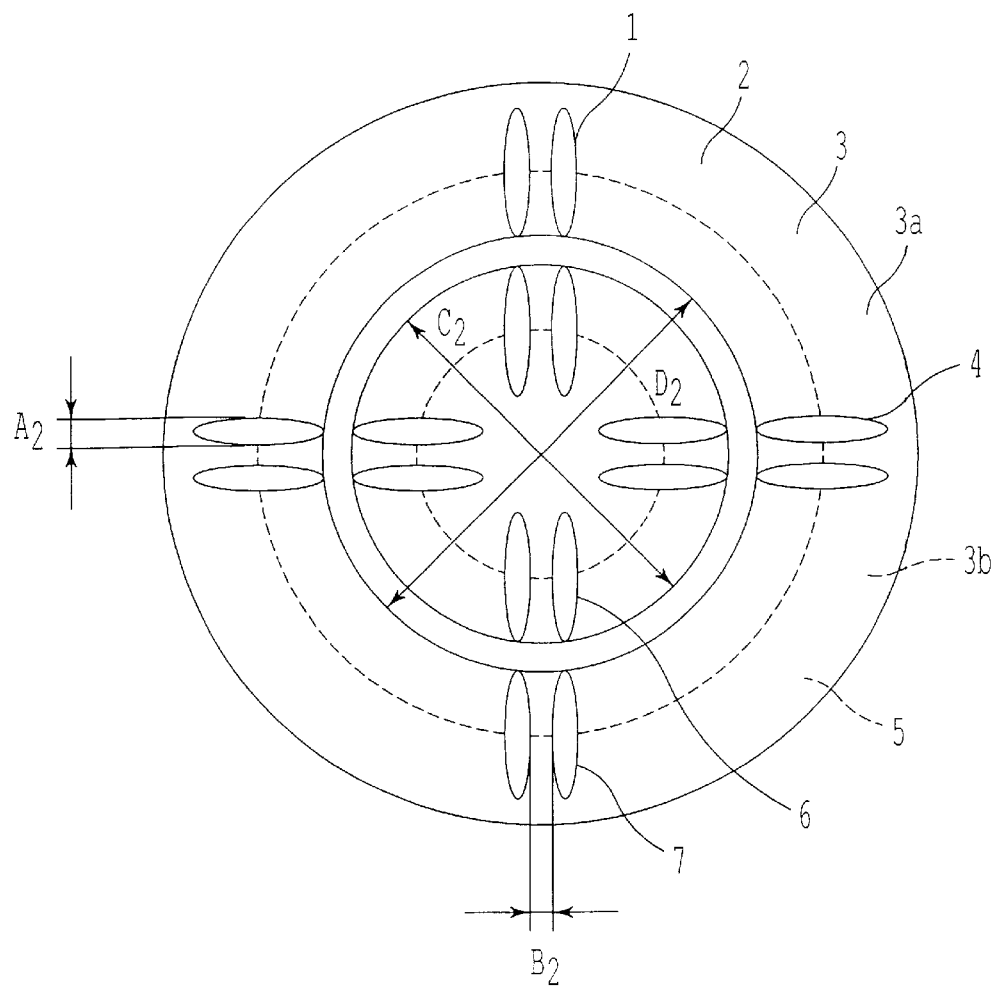
FIG. 4 is a schematic view showing a structure of a conventional device.

Note that reference marks other than those described above indicate the same constituents as or corresponding constituents of those attached with the reference marks in FIG. 4 showing a conventional power switching semiconductor device, and therefore descriptions thereof are omitted.

Next, description will be given of the operations. While the performance of the turn-on operation and turn-off operation is similar to that of a conventional device, a turn-on time "tgt" is shorter than in the conventional device, as shown in FIGS. 2 and 3.

In a constitution having such a structure like this, there can be provided a power switching semiconductor device with reduction of a turn-on time, a faster switching speed and a less switching loss.

In addition, since the structure specifies a distance between the segments only, a power switching semiconductor device with high performance can be provided at a low cost due to no cost-up factor associated with improvement on performance.

Further, while in the first embodiment, a case of GTO is shown as an example, the present invention is not limited to GTO but can be applied to a gate commutation thyristor (in which no snubber circuit is required by commutation of a main current to the gate at a turn-off) or the like.

INDUSTRIAL APPLICABILITY

As described above, a power switching semiconductor device according to the present invention is suited for use in a power switching semiconductor device for controlling an inverter of a motor in an electric locomotive and the like.

What is claimed is:

1. A power switching semiconductor device, comprising:
    a first main electrode which is divided into a plurality of segments to form segment rows of a multiconcentric circle;
    a control electrode surrounding the plurality of segments and formed on a front major surface of a semiconductor substrate; and
    a second main electrode formed on a rear major surface of the semiconductor substrate,
    wherein a turn-on operation is performed between the first main electrode and the second main electrode with a control signal inputted from the control electrode,
    wherein dimensions of the power switching semiconductor device satisfy the following relationships:

$$0 < B \leq \alpha \times A$$

$$0.5 \leq \alpha \leq 1.5$$

$$(D-C)/2 \leq \beta \times A$$

$$0.5 \leq \beta \leq 1.5$$

where A is a width of each segment of the plurality of segments that form said segment rows in a circumferential direction, B is a distance between adjacent segments in a circumferential direction arrangement, C is an outer diameter of an inner segment row, and D is an inner diameter of an outer segment row,
        wherein the distance B between adjacent segments is the same for one segment row as compared to another segment row and a distance between adjacent inside edges of the plurality of segments is the same for one segment row as compared to another segment row, and
        wherein the width A is the same for one segment row as compared to another segment row.

* * * * *